United States Patent [19]

Houghton

[11] Patent Number: 4,647,339
[45] Date of Patent: Mar. 3, 1987

[54] PRODUCTION OF SEMICONDUCTOR DEVICES

[75] Inventor: Andrew J. N. Houghton, Totnes, England

[73] Assignee: British Telecommunications, England

[21] Appl. No.: 736,258

[22] Filed: May 21, 1985

[30] Foreign Application Priority Data

May 23, 1984 [GB] United Kingdom ............... 8413170

[51] Int. Cl.$^4$ .................... H01L 21/306; B44C 1/22; C03C 15/00; C03C 25/06
[52] U.S. Cl. .................. 156/643; 29/569 L; 29/580; 29/591; 156/646; 156/649; 156/652; 156/655; 156/659.1; 156/662; 357/30; 357/56
[58] Field of Search ................ 29/569 L, 580, 591; 357/15, 16, 17, 30, 56, 65; 156/643, 646, 649, 652, 655, 659.1, 662; 252/79.1

[56] References Cited

U.S. PATENT DOCUMENTS 4,213,805 7/1980 Tsukada ........................ 156/649 X
4,341,010 7/1982 Tijburg et al. ................. 156/649 X

FOREIGN PATENT DOCUMENTS 0162484 12/1979 Japan ................... 156/649

OTHER PUBLICATIONS

Soviet Journal of Quantum Electronics, vol. 10, No. 1, Jan. 1980, pp. 60–63, American Institute of Physics, New York, US; Yu A. Bykovskii et al: Electrooptic radiation modulators utilizing semiconductor ridged waveguides, p. 60, col. 2, lines 13–21.
IEEE Journal of Quantum Electronics, vol. QE-18, No. 4, Apr. 1982, pp. 795–800, IEEE, New York, US; M. W. Austin: "GaAs/GaAlAs Curved Rib Waveguides", p. 796, col. 2, lines 20–30.
Le Vide, Les Couches Minces, vol. 35, No. 204, Nov./Dec. 1980, pp. 317–336, Paris, FR; D. Dieumegard: "Purverisation et Technologies d'Erosion Ionique", p. 324, lines 1–15, FIG. 16.
Electronics Letters, vol. 20, No. 7, Mar. 29, 1984, pp. 295–297, London, GB: P. Buchmann et al: "Reactive Ion Etched GaAs Optical Waveguide Modulators, With Low Loss and High Speed", p. 296, lines 4–7.

Primary Examiner—William A. Powell
Attorney, Agent, or Firm—Nixon & Vanderhye

[57] ABSTRACT

Onto the surface of an initial semiconductor structure 1, 2, 3, 4 is deposited a layer of an organic material 5 having a window 9. Layers 6', 7', and 8' are deposited on the exposed surface of the semiconductor, of which 8' is an ion-beam resisting material. Corresponding layers 6, 7, and 8 are deposited on the organic material. The organic material is then lifted off together with layers 6, 7, and 8. Ion-beam milling of the semiconductor material to either side of 8' followed by removal of any remnant of 8' results in a structure having an elevated semiconductor portion carrying an electrode 6', 7'.

Preferred materials are gallium arsenide for layers 1 and 3, gallium aluminium arsenides for layers 2 and 4, titanium for layers 6' and 8', and gold for layer 7'.

The invention can be applied to the production of rib waveguide electrooptic devices, including phase modulators.

13 Claims, 4 Drawing Figures

PRODUCTION OF SEMICONDUCTOR DEVICES

The present invention relates to semiconductor devices, especially those suitable for use as modulators and directional couplers in optical communications systems.

There is increasing interest in coherent optical fibre transmission systems in which phase shift keying (PSK) is employed; see, for example, Y Yamamoto and T Kimura, Coherent Optical Fibre Transmission Systems, IEEE J Quantum Electronics, 1981, QE-17, pages 919 to 935. Investigation of such systems is still at the laboratory stage, but a necessary requirement for their use in telecommunications networks is the availability of phase modulators of adequate performance in sufficient quantity. Phase modulators may be applied in other ways relevant to optical communications, e.g. in directional couplers and interferometric amplitude modulators.

Silica optical fibres as produced in recent years have loss minima at 1.3 μm and 1.55 μm approximately, the latter minimum being the deeper. Accordingly, there is an especial need for devices operating in the range from 1.1 to 1.65 μm, especially from 1.3 to 1.6 μm. (These wavelengths, like all the wavelengths herein except where the context indicates otherwise, are in vacuo wavelengths.)

J Brandon, A Carenco, L Menigaux, and M Rondot presented a paper "Double-heterostructure GaAs-$Al_xGa_{1-x}As$ rib waveguide directional coupler switch" at the Second European Conference on Integrated Optics in Florence in October 1983 (pages 69–71) in which they describe a directional coupler. The coupler includes a GaAs substrate with an ohmic contact on its underside and, on top of this substrate, sequential layers of $Al_xGa_{1-x}As$ and GaAs, the latter layer having two parallel ribs close together on its upper side. The ribs in the GaAs layer are capped with $Al_xGa_{1-x}As$ and then Schottky barrier electrodes. Light injected into the upper GaAs layer beneath a rib is confined laterally by the rib and vertically by the adjacent $Al_xGa_{1-x}As$ layers although there is coupling between the ribs. This coupling can be controlled by applying potentials between the upper electrodes and the ohmic contact.

(Here, and throughout this specification, terms such as "underside", "top", "upper", "elevated", "uppermost", etc. are to be taken to indicate merely a reference direction and not the actual orientation of a device in space.)

P Buchmann, H Kaufmann, and H Melchior, in "GaAs waveguide-modulators and directional couplers with low losses for high speed operation at 1.3 μm", Proc. 8th European Conference on Optical Communications (ECOC '83), Geneva, 1983, describe modulators and directional couplers having an upper ribbed layer of lightly n-doped (n⁻) GaAs and a lower layer of heavily n-doped (n⁺) GaAs, a Ti-Pd-Au Schottky contact being provided on top of the ridge.

In order to make the ribs, Brandon et al employ chemical etching in a manner not precisely specified. Buchmann et al use a self-aligning technique in which the desired Schottky contact is formed on a layer of the n⁻-GaAs by a lift-off technique and reactive ion etching in a $CCl_2F_2$ discharge is used to etch semiconductor material to either side of the contact (the contact acting as a resist).

Ion-beam milling to form ribs has been previously described by I P Kaminow, R E Nohory, M A Pollack, L W Stulz, and J C DeWinter in "Single mode c.w. ridge-waveguide laser emitting at 1.55 μm", Electronics Letters, volume 15, pages 763–765 (1979); by D Dieumegard in "Pulverisation et Technologies d'Erosion Ionique", Le Vide, les Couches Minces, Volume 35, No. 204, pages 317–336 (November/December 1980); by M W Austin and P G Flavin in "Small radii curved rib waveguides in GaAs/GaAlAs using electron-beam lithography", J Lightwave Technology, volume LT-1, no 1 (March 1983); by A J N Houghton, D A Andrews, G J Davies, and S Ritchie in "Low-loss optical waveguides in MBE-grown GaAs/GaAlAs heterostructures", Optics Communications, volume 46, pages 164–166 (July 1983); and by A J N Houghton and P M Rodgers in "The fabrication of guided wave optical modulators and switches in semiconductors", British Telecom Technology Journal, volume 1, No 2 (October 1983). However, the techniques described in the first four of these papers do not offer the possibility of the self-aligning formation of a satisfactory Schottky barrier contact on top of a rib, while the technique in the fifth of these papers (Houghton and Rogers), although self-aligning, requires three distinct etching steps, one or two of which are performed other than by ion-beam milling. For the purpose of producing a semiconductor device having a Schottky barrier contact on top of a rib none of these proposals are very attractive. Even where such a device is described the alignment difficulties on the one hand and multiple-step processing on the other will make for low yields.

Ion-beam milling is an attractive technique capable in principle of high reproducibility and precision in production (this being especially important in heterostructure devices similar to those prepared by Brandon et al), and the present invention is based in part on our surprising discovery that ion-beam milling can be used in such a manner as to be self-aligning without the need for additional etching steps.

The present invention provides a process for fabricating a semiconductor structure including an elevated semiconductor portion, which portion carries an electrode on its uppermost surface, advantageously a metal electrode, which comprises the steps of (i) providing on the semiconductor surface of an initial semiconductor structure a layer of an organic material having a window corresponding in position to the desired elevated portion;

(ii) applying a layer or layers of material for constituting the electrode and further a layer of ion-beam resisting material to the portion of the semiconductor surface exposed by the window;

(iii) treating the product of step (ii) in such manner as to remove the organic material and therewith any of the materials applied to the organic material in the course of step (ii); and (iv) ion-beam milling the exposed portions of the semiconductor material so as to produce the desired elevated portion.

An especially important case for application of the present invention is where the surface of the initial semiconductor structure of step (i) is gallium arsenide. If this surface layer is lightly doped n-type and lies above more heavily doped n-type gallium arsenide and the ion-beam milling in step (iv) proceeds as far as a level within the layer of lightly doped gallium arsenide, then a device similar to that described by Buchmann et al, q.v., can be fabricated.

A most especially important case for application of the present invention is where the surface of the initial semiconductor structure of step (i) is gallium aluminium arsenide $Ga_xAl_{1-x}As$. If this surface layer lies above a gallium arsenide layer and (beneath that) a further aluminium gallium arsenide layer, and the ion-beam milling in step (iv) proceeds as far as a level within the gallium arsenide layer, then a device similar to that described by Brandon et al, q.v., can be fabricated. Ion beam milling proves an especially advantageous technique in this context because of its precision and reproducibility.

The present invention can also be applied to devices based on other semiconductor systems, especially other III-V semiconductor systems, and most especially the $InP/Ga_xIn_{1-x}As_yP_{1-y}$ system. This latter would be especially convenient in integrated devices. A problem in this system is that Schottky barrier contacts (permitting application of reasonably high fields with low current flow) are not readily made with these materials. A reverse-biased p-n junction could be conveniently used in such a case to overcome this difficulty.

Where the surface of the initial semiconductor structure is indium phosphide, it can be advantageous to deposit a thin layer, of about 0.1 μm thickness, of indium gallium arsenide on that surface. By doing so electrical contact between the electrode and the semiconductor structure can be improved.

Preferably, in step (ii) two or more layers of material constituting the electrode are deposited. Usually, the material or materials used will be of metal, although other sufficiently conductive materials such as certain oxides may be used. Suitably, the material of the first of these is chosen for good adhesion to the semiconductor (e.g. titanium) and that of the second or last layer is chosen to facilitate electrical connection (e.g. gold). In step (ii) a convenient ion-beam resisting material is titanium, although other metals, e.g. chromium, may also be used.

It will be appreciated by the reader skilled in the art that in step (iv) the layer of ion-beam resisting material will itself be milled although of course slowly. If by the time that the semiconductor is milled to the desired depth some of this material remains protecting the layers of the material constituting the electrode it needs to be subsequently removed. For titanium, plasma etching in carbon tetrafluoride is suitable. An alternative which eliminates a process step is to adjust the thickness of the resisting material such that it has just been removed by the ion-beam milling at the time when the semiconductor has been milled to the desired depth. In such a case, the electrode material immediately below the resisting layer (e.g. gold) can be made thicker to compensate for the relatively rapid attack of the ion-beam on such material.

The ion-beam resisting material is advantageously such that the milling rate in step (iv) of the semiconductor material is at least 1.5 times greater than that of the ion-beam resisting material (these rates being in depth removed per unit time), preferably at least 2 times greater, and more preferably at least 3 times greater (e.g. 5 times greater). Usually the electrode material immediately beneath the ion-beam resisting material is one which if exposed under the same conditions as step (iv) would mill at least 1.5 times faster than the ion-beam resisting material, more usually at least 2 times faster, and most usually at least 3 times faster (e.g. 10 times faster).

It may be convenient to introduce a gas such as chlorine, bromine, iodine or oxygen during step (iv). The milling rate can thus be considerably reduced, allowing better control to be effected.

The organic material applied in step (i) and "lifted off" in step (iii) is conveniently a commercially available organic resist material, either of the photoresist or the electron-beam resist type. This permits the formation of the required window by conventional lithography.

Preferably the layer provided in step (i) comprises two or more sublayers. This facilitates the creation of a window having a wall with a controllably undercut cross-section. Such a cross-section, which is known to be desirable in "lift-off" techniques, is obtained by using materials for the sublayers, the lowermost of which is etched faster than the uppermost during creation of the window. The use of such sublayers produces more reliable results than for instance the technique of relying on the characteristic etching action of chlorobenzene, on a single layer of organic material, which tends to etch faster in proximity to the relevant substrate.

The fabrication of the initial semiconductor structure is advantageously performed by molecular beam epitaxy (MBE). This technique is particularly attractive because it can provide large-area slices of good growth morphology. This is especially important for guided wave devices such as phase modulators and directional couplers, which are much larger in general than lasers and detectors for which smaller slices grown by liquid phase epitaxy (LPE) are commonly used. Thus, for example, one might use an MBE slice of size 40 mm×35 mm with a view to eventual subdivision into up to 500 devices of size 4 mm×0.5 mm.

The present invention will be now more particularly described, by way of example but without limitation, by reference to the accompanying figures of which FIG. 1 shows in section, schematically and not to scale (hatching lines, however, being omitted), a process stage in the production of a heterostructure single mode rib waveguide phase modulator in accordance with the process provided by the present invention, the stage in question being the end of step (ii) and the lower part of the device being omitted;

The fabrication procedure up to the process stage shown in FIG. 1 will now be described.

Figure 1:
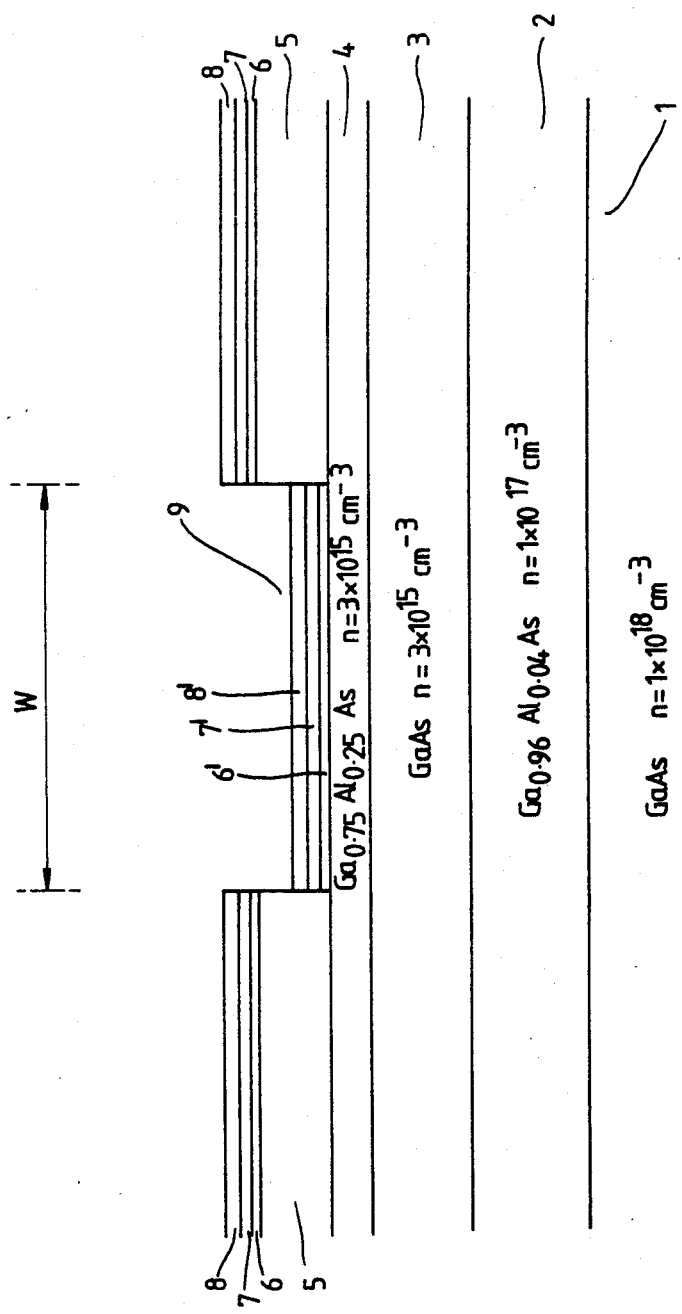

The initial semiconductor structure used for step (i) consisted of an n-type gallium arsenide substrate, layer 1 in FIG. 1, with carrier concentration $1\times10^{18}$ cm$^{-3}$ on the surface of which (10 mm×5 mm in size) the following layers had been grown by molecular beam epitaxy:

layer 2, approximately 2 μm thick, of n-type $Ga_{0.96}Al_{0.04}As$ with a carrier concentration of $1\times10^{17}$ cm$^{-3}$;

layer 3, approximately 1.7 μm thick, of n-type gallium arsenide with a carrier concentration of $3\times10^{15}$ cm$^{-3}$; and layer 4, from 0.3 to 0.6 μm thick (a range of thicknesses were used in our experiments), of n-type $Ga_{0.75}Al_{0.25}As$ with a carrier concentration of $3 \times 10^{15}$ cm$^{-3}$.

A 1 μm thick layer of Shipley positive photoresist AZ 1350H was spun onto the surface of layer 4, and the resist was exposed to ultraviolet light through a mask, then soaked in chlorobenzene (to facilitate subsequent lift-off), and then developed in the recommended Shipley photoresist developer. In this way a layer of fixed resist 5 interrupted by windows such as 9 is achieved. The windows took the form of parallel stripes 300 μm apart and of width W 3, 4, or 5 μm running normal to the plane of the paper in FIG. 1 extending along the 10 mm length of layer 4. At 1 mm intervals the windows had lateral extensions corresponding to bonding pads in the finished device.

Step (ii) was now performed by evaporation of metals from heated filaments. Layers of metal were deposited on the surface of layer 5 and on the exposed parts of layer 4 as follows:

layers 6 and 6' of titanium, 200 Å (0.02 μm) thick;

layers 7 and 7' of gold, approximately 1800 Å (0.18 μm) thick; and layers 8 and 8' of titanium, approximately 2000 Å (0.2 μm) thick.

(It is in respect of these layer thicknesses that the figures are most especially not to scale.)

At this point the stage depicted in FIG. 1 was attained.

Step (iii) was now performed by immersion in acetone with ultrasonic vibration for a time period of seconds. Layers 5, 6, 7, and 8 were thereby removed, leaving the surface of 4 carrying only layers 6', 7', and 8'.

Now step (iv) was carried out by milling the surface with Ar+ ions of 500 eV energy at a current density of 0.5 mA cm$^{-2}$ at normal incidence for 45 minutes. In this way, the semiconductor layer 4 was completely removed to either side of layers 6', 7', and 8' and ion-beam milling was stopped when a total depth (H in FIG. 2, corresponding to the thickness of layer 4 plus part of layer 3) of 0.9 μm had been achieved, layer 3 now having been converted into a thinned portion 3" and a portion 3' of the original thickness. At this stage layer 8' had been reduced to about one-tenth of its original thickness (i.e. to about 200 Å or 0.02 μm).

It may be useful to note here that under these conditions in our apparatus we have found the milling rates of titanium, gallium arsenide, and gold to be approximately 40 Å/min, 200 Å/min, and 400 Å/min respectively.

Then layer 8' was removed by etching in a barrel plasma etcher for 5 minutes with carbon tetrafluoride gas. In this way the structure shown in FIG. 2 was achieved.

Figure 2:
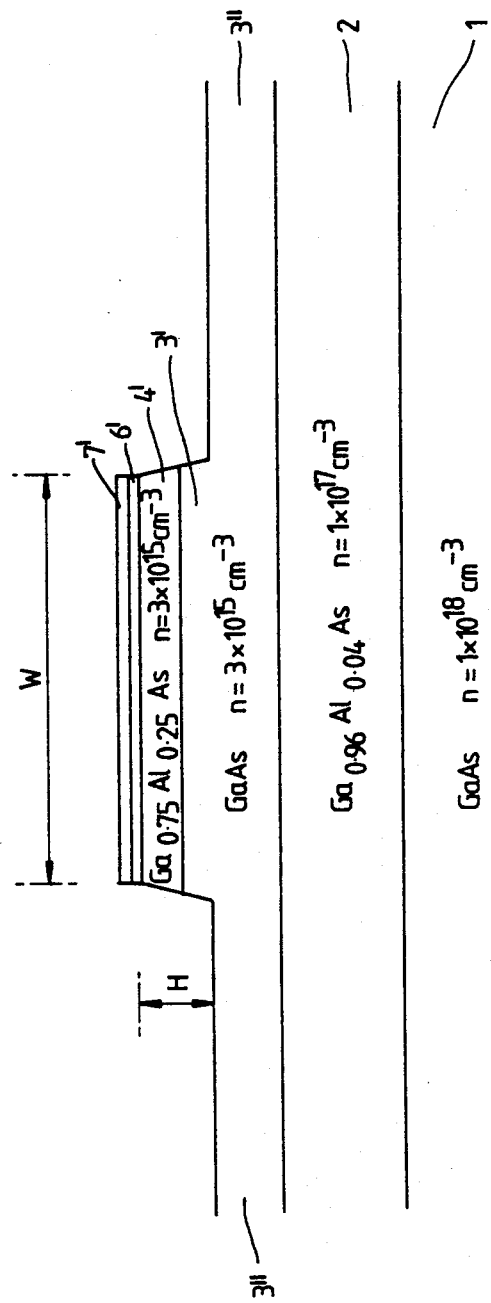
FIG. 2 shows in section schematically and not to scale, (hatching lines, however, being omitted), a completed device, the lower part of the device being omitted.

It will be seen that in FIG. 2 the elevated semiconductor portion consists of 3' and 4', and that this portion carried a metal electrode 6' and 7'.

It will be appreciated that the reproducibility and precision of ion beam milling is especially advantageous if structures such as are shown in FIG. 2 are to have well-controlled H.

The 10 mm × 5 mm product with lengthwise ribs was now cleaved three times perpendicular to its length, namely near both ends to provide clean surfaces and in the middle. Then scribing between the ribs gave numerous devices for test.

Figure 3:
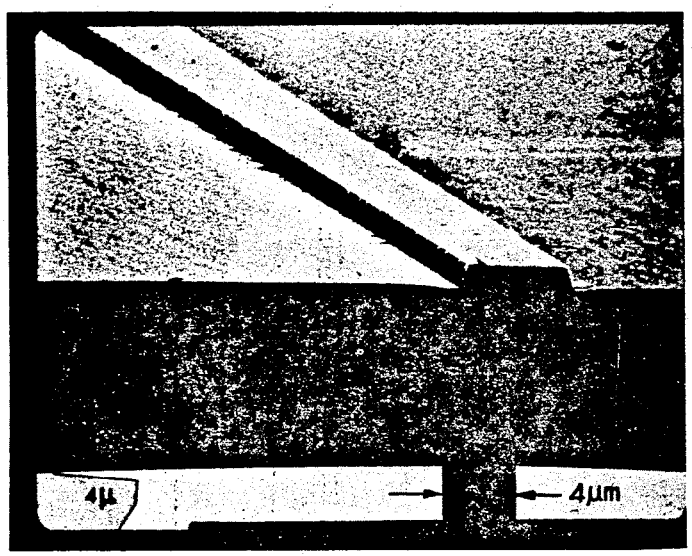
FIG. 3 shows an electron micrograph of the upper part of a completed device.

FIG. 3 shows a scanning electron micrograph of a device in which W is 5 μm.

The devices were then mounted in dual-in-line (d.i.l.) packages by means of thermocompression wedge bonding to the lateral extensions of the ribs corresponding to the lateral extensions in the resist windows referred to above. The underside of the substrate was provided with an ohmic contact by means of silver epoxy resin.

The whole fabrication process just described involved only six steps (MBE growth, resist application, metallisation, lift off, ion beam milling, and plasma etching) and in particular did not include chemical etching, and because of its simplicity gave high chip yields. Final device yields in practice will depend on packaging.

In order to perform tests on the phase modulator, light was coupled into the guiding layer 3" and 3' beneath the rib, the light travelling in a direction normal to the plane of FIG. 2. Tests were performed both with light of wavelength 1.32 μm from a Nd-YAG laser and with light of wavelength 1.15 μm from a He-Ne laser, although the device was also capable of functioning at a wavelength of 1.55 μm. A potential difference was applied between the ohmic contact on the underside of substrate 1 and layer 7' of gold, the substrate being positive. The sense of the potential difference was thus such that 7', 6', and 4 form a Schottky barrier (i.e. only a small current flow being permitted, of the order of 100 μA).

In the completed device, the gallium arsenide layer 3" and 3' is the guiding layer, with the gallium aluminium arsenide layers 2 and 4' acting as confinement layers. Layers 4' and 2 avoid or reduce absorption by the metal electrode 6', 7' and the highly doped substrate 1 respectively.

The doping profile is designed to give maximum overlap between the applied electric field and the guided wave. Because the induced phase shift is proportional to the electric field strength, low voltage operation is favoured by low doping levels in the $Ga_{0.75}Al_{0.25}As$ cap layer 4' and the GaAs guide layer 3', 3".

Figure 4:
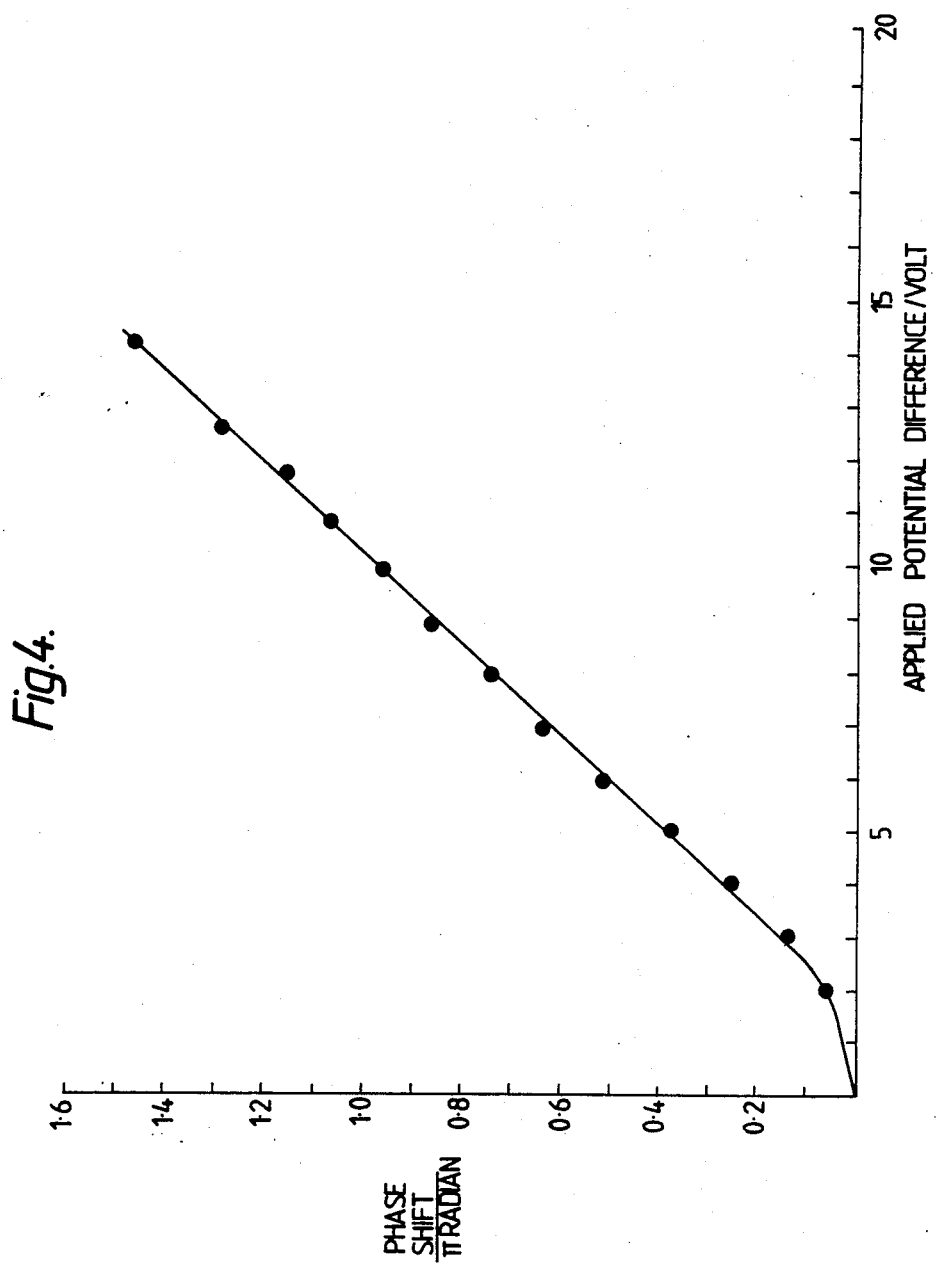
FIG. 4 displays the functioning as a phase modulator of a completed device similar to (but not identical with) that shown in FIG. 3, in the form of a plot of measured phase change against applied potential.

In FIG. 4, results are shown for a device in which width of the rib W is 3 μm, the length is 4.6 mm, and the thickness of layer 4' is 0.3 μm. The graph shows the phase change in 1.15 μm radiation as a function of the applied potential difference. The phase change was measured by applying a voltage to the device, placed between crossed polaroids, and cancelling the induced relative TE-TM phase shift using a calibrated Soleil compensator. The compensator was also used to null out the intrinsic birefringence of the guide.

While, as FIG. 4 shows, a phase shift $\pi$ in 1.15 μm radiation was achieved for an applied potential difference of 10.7 V, a potential difference of 11.8 V was required for 1.32 μm radiation. Since phase shift is proportional to device length, it can be seen that $\pi$ shift will be obtained for 5 V in a device 10 mm long. Measurements on devices from another slice gave a $\pi$ phase change at 9 V for a device length of 4.2 mm, stripe width W of 5 μm, and a cap layer 4' 0.6 μm thick for a wavelength of 1.15 μm.

Comparison of loss measurements on short and long devices gave an optical propagation loss of 5.5 dB cm$^{-1}$ for the TE mode, which gives an internal loss of <2.5 dB for devices of length 4.2 mm to 4.6 mm. The capacitance of a device bonded into a d.i.1 package was measured to be 1.7 pF. The capacitance is kept low by using the minimum necessary electrode area. Optical pulse rise and fall times <500 psec (limited by the response of the measurement system) have been measured on devices of this electrode structure. We therefore believe that devices of this type will be suitable for PSK systems operating up to at least 1.2 Gbit s$^{-1}$.

An advantage of this heterostructure over Buchmann et al's n$^-$/n$^+$ structure previously described is that in the latter there is more absorption by metal electrodes unless the guiding layer thickness is increased with the consequence that higher applied potential differences are required for a given phase change.

Loss measurements on devices with layer 4' 0.3 μm thick indicated TM absorption of >10 dB cm$^{-1}$ and thereby a contribution to optical loss from electrode absorption. TM absorption was, however, <3 dB cm$^{-1}$ for thicknesses of 4' >0.4 μm, indicating that TE absorption loss was negligible.

On referring once again to FIG. 3, some roughness along the edge of the rib can be seen. We believe that this occurs because ion-beam milling at normal incidence replicates the edge roughness of the original photoresist profile. Milling at an angle to normal incidence may reduce this. The loss measurements suggested also that scattering at waveguide imperfections (which have a random distribution with length) is a significant loss mechanism. The presence of these imperfections in devices highlights the importance of a dust-free humidity controlled environment for both layer growth and device fabrication. We believe that it will prove possible to reduce the propagation loss to <2 dB cm$^{-1}$ similar to those reported by Houghton et al, q.v., for MBE rib waveguides without electrodes. This would give devices with internal loss <1 dB.

We are not aware of superior overall performance to the above having been previously achieved in semiconductor guided wave devices, in which perhaps one parameter has been optimised at the expense of others.

In technical application of the devices, coupling of the devices to monomode fibre tails and the application of antireflection λ/4 coatings (e.g. SiO$_2$ or Al$_2$O$_3$) is likely to be required. Some adjustment of the rib dimensions (width, height, and layer thickness) may be desirable for optimising the overlap of the mode profiles of the new fibre and the waveguide. By attention to these details, acceptable packaging losses for fully-engineered systems should we believe be achievable. An alternative approach would be the fabrication of an integrated laser-modulator structure, which would avoid some of the problems of device-fibre coupling.

While there may be further scope for improvement of the loss and voltage characteristics by further optimisation and refinement of the detailed design and fabrication, we do not believe that the importance of such further improvements will necessarily outweigh the advantages of attention to packaging or (especially) integration.

Finally, we should mention that it will be apparent to the man skilled in the art that the processes and structures particularly described above can be adapted to the production of high performance amplitude modulators and directional couplers by defining the appropriate electrode pattern.

I claim:
1. A process for fabricating a semiconductor structure including an elevated semiconductor portion, which portion carries an electrode on its uppermost surface, which comprises the steps of
   (i) providing on the semiconductor surface of an initial semiconductor structure a layer of an organic material having a window corresponding in position to the desired elevated portion;
   (ii) applying a layer or layers of material for constituting the electrode and further a layer of ion-beam resisting material to the portion of the semiconductor surface exposed by the window;
   (iii) treating the product of step (ii) in such manner as to remove the organic material and therewith any of the materials applied to the organic material in the course of step (ii); and
   (iv) ion-beam milling the exposed portions of the semiconductor material so as to produce the desired elevated portion.

2. A process according to claim 1, wherein the surface of the initial semiconductor structure of step (i) is gallium arsenide or gallium aluminium arsenide.

3. A process according to claim 1, wherein the surface of the initial semiconductor structure of step (i) is indium phosphide or gallium indium arsenide phosphide.

4. A process according to any preceding claim, wherein in step (ii) a layer or layers of material for constituting the electrode are deposited at least one of which is of metal.

5. A process according to any of claims 1 to 3, wherein in step (ii) two or more layers of material for constituting the metal electrode are deposited the first of which materials is titanium and the second or last of which is gold.

6. A process according to claim 1, 2 or 3, wherein the ion-beam resisting material is titanium or chromium.

7. A process according to claim 1, 2, or 3, wherein after step (iv) is completed some of the ion-beam resisting material remains and this material is removed in a further step.

8. A process according to claim 7, wherein the remaining ion-beam resistant material is removed by plasma etching.

9. A process according to any of claims 1 to 3, wherein step (iv) is continued until after all of the ion-beam resisting material has been removed.

10. A process according to claim 1, 2, or 3, wherein the organic material is a photoresist or an electron-beam resist.

11. A process for fabricating a semiconductor structure capable of producing a controlled optical phase shift along an elevated semiconductor portion thereof which portion carries an electrode on its uppermost surface, said process comprising:
   providing a layered semiconductor structure having a doped layer of a first type between doped layers of a second type;
   applying at least one shaped area of material on top of said layered structure located where said elevated portion is desired, said material constituting said electrode and also forming an ion beam resisting surface over said shaped area; and
   ion-beam milling said structure with said material thereon sufficiently to remove the upper layer of said second type and a portion of said first type layer except under said shaped area.

12. A process according to claim 1, wherein the surface of the initial semiconductor structure of step (i) is indium gallium arsenide.

13. A process for fabricating a semiconductor structure including an elevated semiconductor portion, which portion carries an electrode on its uppermost surface, which comprises the steps of:
   (i) providing on the semiconductor surface of an initial semiconductor structure a layer of an organic material having a window corresponding in position to the desired elevated portion;

(ii) applying a layer or layers of material for constituting the electrode and forming an ion-beam resisting surface to the portion of the semiconductor surface exposed by the window;

(iii) treating the product of step (ii) in such manner as to remove the organic material and therewith any of the materials applied to the organic material in the course of step (ii); and (iv) ion-beam milling the exposed portions of the semiconductor material so as to produce the desired elevated portion.

* * * * *